United States Patent
Choi (10) Patent No.: US 8,643,799 B2
(45) Date of Patent: Feb. 4, 2014

(54) TFT-LCD ARRAY SUBSTRATE AND MANUFACTURING METHOD THEREOF

(75) Inventor: Hyun Sic Choi, Beijing (CN)

(73) Assignee: Beijing Boe Optoelectronics Technology Co., Ltd., Beijing (CN)

(*) Notice: Subject to any disclaimer, the term of this patent is extended or adjusted under 35 U.S.C. 154(b) by 705 days.

(21) Appl. No.: 12/861,001

(22) Filed: Aug. 23, 2010

(65) Prior Publication Data

US 2011/0050672 A1  Mar. 3, 2011

(30) Foreign Application Priority Data

Aug. 27, 2009 (CN) .......................... 2009 1 0090566

(51) Int. Cl.
*G02F 1/136* (2006.01)
*G02F 1/1343* (2006.01)

(52) U.S. Cl.
USPC ............................................ 349/43; 349/141

(58) Field of Classification Search
USPC .......................................... 349/141, 43, 156
See application file for complete search history.

(56) References Cited

U.S. PATENT DOCUMENTS

| 4,194,440 A | 3/1980 | Gorig | |
|---|---|---|---|
| 7,057,695 B2 * | 6/2006 | Mun et al. | 349/141 |
| 8,194,219 B2 * | 6/2012 | Hirota | 349/141 |

FOREIGN PATENT DOCUMENTS

| CN | 101393363 A | 3/2009 |
|---|---|---|
| KR | 20070023998 A | 3/2007 |

* cited by examiner

*Primary Examiner* — James Dudek
(74) *Attorney, Agent, or Firm* — Ladas & Parry LLP (57) ABSTRACT

A TFT-LCD array substrate comprising a transparent substrate and a gate line, a data line, a thin film transistor, a pixel electrode and a passivation layer that are formed on the transparent substrate. The passivation layer includes a first region corresponding to the pixel electrode, a second region corresponding to the gate line and a third region corresponding to the data line, the first region has a first thickness, the second region has the second thickness, and the third region has the third region. The first thickness is smaller than the second thickness, the second thickness is smaller or equal to the third thickness.

7 Claims, 8 Drawing Sheets

TFT-LCD ARRAY SUBSTRATE AND MANUFACTURING METHOD THEREOF

BACKGROUND OF THE INVENTION

Embodiments of the invention relate to a liquid crystal display array substrate and a manufacturing method thereof.

Thin film transistor liquid crystal displays (TFT-LCDs) are an important type of flat panel displays (FPDs).

TFT-LCDs can be classified into a vertical electrical field type and a horizontal electrical field type depending on the direction of the electrical field by which the liquid crystal is driven. For a vertical electrical field type TFT-LCD, a pixel electrode is formed on an array substrate while a common electrode is formed on a color filter substrate. For a horizontal electrical field type TFT-LCD, both a pixel electrode and a common electrode are formed on an array substrate. Therefore, an additional patterning process for forming the common electrode is required when a horizontal electrical filed type TFT-LCD array substrate is manufactured. A vertical electrical field type TFT-LCD comprises a twist nematic (TN) type TFT-LCD. A horizontal electrical field type TFT-LCD comprises a fringe field switching (FFS) type TFT-LCD and an in-plane switching (IPS) type TFT-LCD. A horizontal electrical field type TFT-LCD, especially an FFS type TFT-LCD, has advantages such as wide view angles and high aperture ratio and have been widely used in practice.

Currently, an FFS type TFT-LCD array substrate is manufactured by forming structural patterns via a plurality of patterning processes. Each patterning process comprises processes such as masking, exposing and developing of photoresist, etching and removing remaining photoresist. An etching process comprises a dry etching process or a wet etching process. Therefore, the complexity of a method for manufacturing a TFT-LCD array substrate can be evaluated based on the numbers of the employed patterning processes, and reducing patterning processes means decreasing manufacturing cost. A conventional six-patterning process for an FFS TFT-LCD array substrate can comprise: patterning for a common electrode, patterning for a gate line and a gate electrode, patterning for an active layer, patterning for source/drain electrodes, patterning for a through hole, and patterning for a pixel electrode.

In addition, for example, a conventional four-patterning process for manufacturing an FFS TFT-LCD array substrate comprises the following steps.

Step 1, depositing a first metal film, and forming a gate line, a common electrode line and a gate electrode by a first patterning process with a normal mask.

Step 2, depositing a gate insulating film, an active layer (including a semiconductor layer and a doped semiconductor layer) film, and forming an active layer by a second patterning process with a normal mask.

Step 3, depositing a first transparent conductive film and second metal film sequentially, and forming a pixel electrode, a source electrode, a drain electrode and a TFT channel by a third patterning with a dual tone mask.

Step 4, depositing a passivation layer and a second transparent conductive layer, forming a passivation layer connection hole, PAD region connection holes and a common electrode, wherein the passivation layer connection hole is used for connection between the common electrode and the common electrode line, a PAD region is a region where leads of a driving circuit board are pressure welded with the array substrate, and electrically connected with the gate line, the data line and the common electrode line on the array substrate via the PAD region connection holes.

An array substrate of an FFS type liquid crystal display manufactured by the above described four-patterning method is characterized in that the common electrode can cover the whole substrate since it is formed in the last step. That is to say, the common electrode is formed above the pixel electrode and also above the signal lines (the gate line, the data line and the common electrode line).

While, for an array substrate of an FFS type liquid crystal display manufactured by the conventional six-patterning method, the common electrode cannot cover the whole substrate and is only formed below the pixel electrode since the common electrode is formed in the first step before forming the gate line and is not electrically connected with the gate line.

According to the array substrate of the FFS type liquid crystal display manufactured by the above four-patterning method, it has a larger aspect ratio when compared with the array substrate of the FFS type liquid crystal display manufactured by the above six-patterning method.

An aspect ratio is determined by an area blocked by a black matrix on a color filter substrate, and the black matrix is provided to block a region over and around the signal lines where the liquid crystal molecules are rotated abnormally.

When the liquid crystal is driven in a TFT-LCD, disturbing electrical fields is formed around the signal lines. Among these disturbing electrical fields, the electrical filed between the common electrode above the pixel electrode and a signal line is the most harmful. The electrical field lines of the electrical field will disturb the rotation of the liquid crystal molecules above the pixel electrode (belonging to the liquid crystal molecules used for normal displaying) so that the image cannot be displayed correctly. In this case, the liquid crystal region that is disturbed should be blocked by a black matrix. Therefore, the more the disturbance, the smaller the aspect ratio.

However, for the array substrate of the FFS type liquid crystal display manufactured by the above four-patterning method, since there is the common electrode above the signal lines, electrical field will be generated between the signal lines and the common electrode thereabove, so that electrical field lines are concentrated in the regions above the signal lines, and the electromagnetic effect between the signal lines and the common electrode above the pixel electrode is weakened. Therefore, the area where the liquid crystal molecules are disturbed around the signal lines is decreased accordingly. Thus, the area blocked by the black matrix will be reduced and the aspect ratio is increased accordingly.

Figure 8:
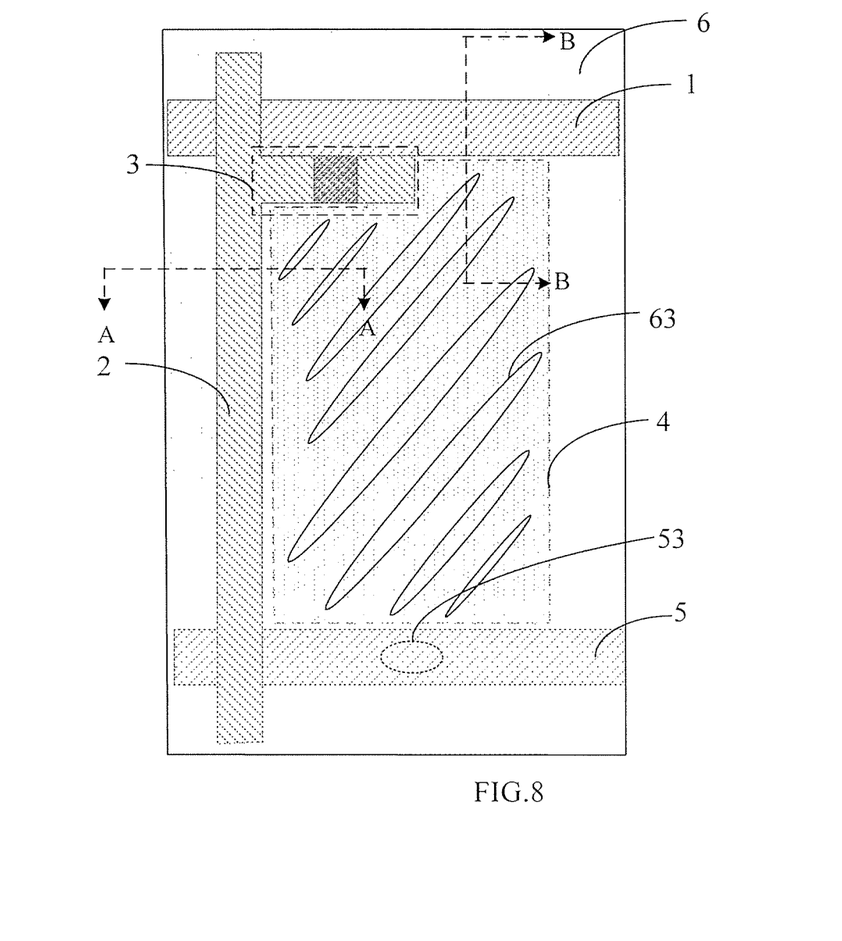
FIG. 8 is a schematic plan view of an array substrate of an FFS type liquid crystal display with a high aspect ratio.
Figure 9A:
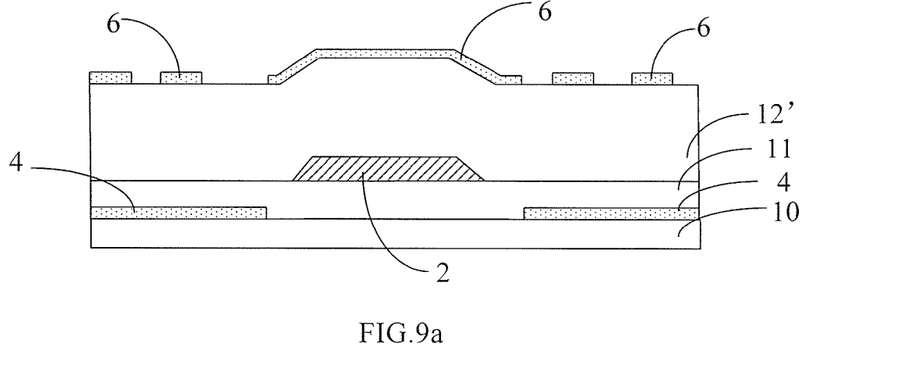
FIG. 9a is a cross-sectional view of FIG. 8 taken along line A-A.

FIG. 8 is a schematic plan view of an array substrate of an FFS type liquid crystal display with a high aspect ratio. FIG. 9a is a cross-sectional view of FIG. 8 taken along line A-A, and FIG. 9b is a cross-sectional view of FIG. 8 taken along line B-B.

Figure 9B:
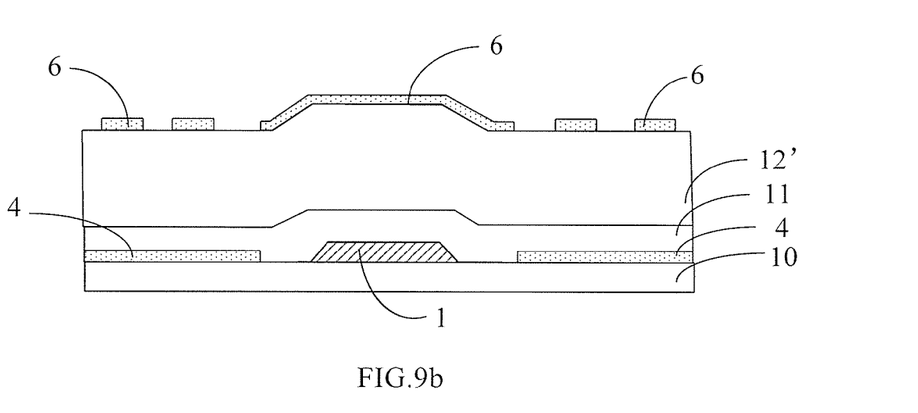
FIG. 9b is a cross-sectional view of FIG. 8 taken along line B-B.

As shown in FIGS. 8, 9a and 9b, the conventional FFS type TFT-LCD array substrate mainly comprises a transparent substrate 10, a gate line 1, a gate insulating layer 11, a data line 2, a thin film transistor (TFT) 3, a pixel electrode 4, a common electrode line 5, a common electrode 6, a passivation layer 12' and etc. Specifically, the gate line 1 and the common electrode line 5 are provided transversely on the transparent substrate 10, and the gate insulating layer 11 covers the gate line 1 and the common electrode line 5. The data line 2 is provided on the gate insulating layer 11 longitudinally. The TFT 3 is provided at the intersection of the gate line 1 and the data line 2. The drain electrode of the TFT 3 is connected with the pixel electrode 4, and the pixel electrode 4 is a plate-like electrode. The passivation layer 12' is formed on the pixel electrode 4, the TFT 3, the data line 2 and the gate insulating layer 11. The common electrode 6 is formed the passivation layer 12'. The common electrode 6 is a slit electrode with slits 63. The common electrode 6 is connected with the common electrode line 5 via a connection hole 53 in the passivation layer 12'.

The gate line 1 is used to provide an "ON" signal to the TFT 3, and the data line is used to provide a data signal to the pixel electrode 4. The TFT 3 is an active switching element. The common electrode line 5 is used to provide a common signal to the common electrode 6. After the gate line 1 provides an "ON" signal to the TFT 3, the data signal from the data line 2 can be inputted into the pixel electrode 4 via the TFT 3, thus an electrical filed for driving the liquid crystal is generated between the pixel electrode 4 and the common electrode 6.

In the above structure, the common electrode is formed above the signal lines, and the aspect ratio is increased. But, if the distance between the signal lines and the common electrode is too small, that is to say, the thickness between the signal lines and the common electrode is too thin, the electrical field formed between the common electrode and the signal lines will disturb the signals from the signal lines, which leads to signal delay and affects the display quality disadvantageously.

For example, in an array substrate of an FFS type liquid crystal display manufactured by the above six-patterning method, the thickness of the passivation layer is 2500 Å. However, in the array substrate as shown in FIGS. 8-9a, if the displaying performance same to that of the array substrate obtained by the above six-patterning method is reached, the thickness of the passivation layer needs to be 6000 Å.

Currently, not only a high aspect ratio but also low power consumption characteristic is demanded in the liquid crystal display field. Especially for the liquid crystal display used in the notebook computer, the low power consumption attracts much attention. However, for the FFS type TFT-LCD array substrate with a high aspect ratio, although the aspect ratio is increased, the too thick passivation layer leads to a large distance between the common electrode and the pixel electrode, thus, a higher driving voltage is needed for a normal operation and the power consumption is increased notably.

However, similarly to the FFS type TFT-LCD array substrate, the passivation layer in the conventional TN type TFT-LCD array substrate also has a uniform thickness in the regions corresponding to the pixel electrode, the gate line and the data line for each pixel region. As for the conventional TN type array substrate, the overlapping portion of the pixel electrode and the common electrode line is formed into a storage capacitor, forming a structure of storage on common. The thicker the passivation layer between the pixel electrode and the common electrode line, the smaller the storage capacitance.

SUMMARY

One embodiment of the invention provides a TFT-LCD array substrate comprising a transparent substrate and a gate line, a data line, a thin film transistor, a pixel electrode and a passivation layer that are formed on the transparent substrate. The passivation layer includes a first region corresponding to the pixel electrode, a second region corresponding to the gate line and a third region corresponding to the data line, the first region has a first thickness, the second region has the second thickness, and the third region has the third region. The first thickness is smaller than the second thickness, the second thickness is smaller or equal to the third thickness.

Another embodiment of the invention provides a manufacturing method of a TFT-LCD array substrate comprising: forming a gate line, a data line, a thin film transistor, a pixel electrode and a passivation layer on a transparent substrate;

wherein, the step of forming the passivation layer comprising: forming a passivation film with a third thickness; forming a passivation layer by patterning the passivation film, the passivation layer comprising a first region corresponding to the pixel electrode, a second region corresponding to the gate line and a third region corresponding to the data line, the first region having a first thickness, the second region having a second thickness and the third region having a third thickness, wherein, the first thickness is smaller than the second thickness, and the second thickness is smaller than the third thickness.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter, the embodiments of the invention will be described in detail in connection with the accompanying drawings.

Figure 1:
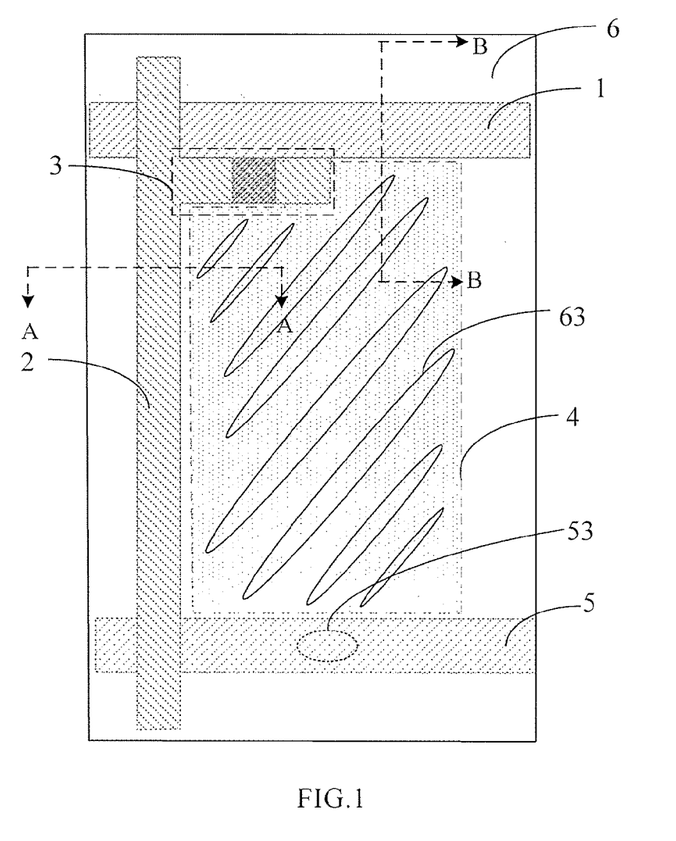
FIG. 1 is a schematic plan view of an FFS type TFT-LCD array substrate according to an embodiment of the invention.
Figure 2A:
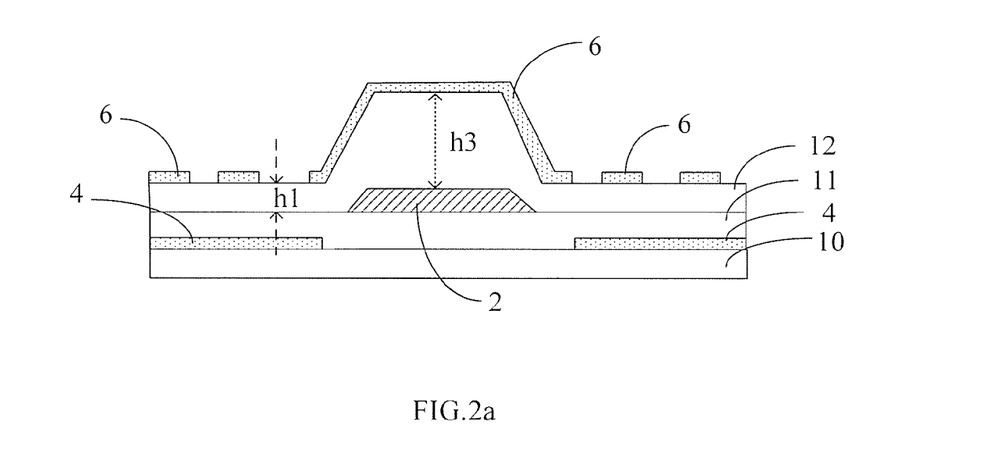
FIG. 2a is a cross-sectional view of FIG. 1 taken along line A-A.

FIG. 1 is a schematic plan view of an FFS type TFT-LCD array substrate according to an embodiment of the invention. FIG. 2a is a cross-sectional view of FIG. 1 taken along line A-A, and FIG. 2b is a cross-sectional view of FIG. 1 taken along line B-B.

Figure 2B:
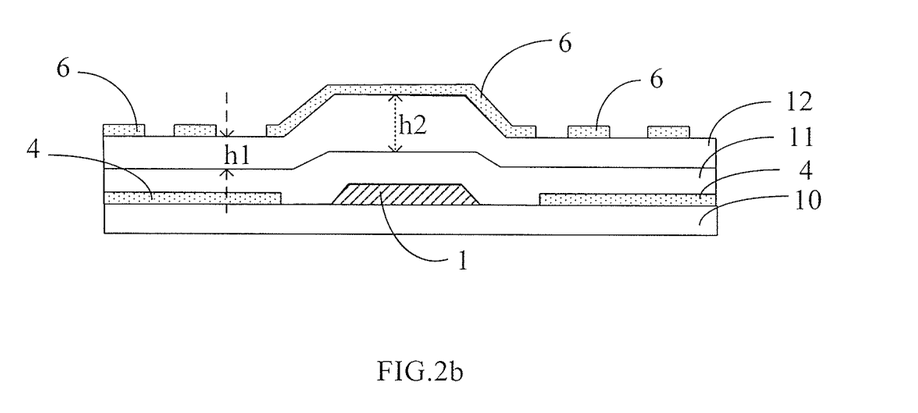
FIG. 2b is a cross-sectional view of FIG. 1 taken along line B-B.

As shown in FIGS. 1, 2a and 2b, the FFS type TFT-LCD array substrate according to the embodiment of the invention mainly comprises a transparent substrate 10, a gate line 1, a gate insulating layer 11, a data line 2, a thin film transistor (TFT) 3, a pixel electrode 4, a common electrode line 5, a common electrode 6, a passivation layer 12 and etc. Specifically, the gate line 1 and the common electrode line 5 are provided transversely on the transparent substrate 10, and the gate insulating layer 11 covers the gate line 1 and the common electrode line 5. The data line 2 is provided on the gate insulating layer 11 longitudinally. The TFT 3 is provided at the intersection of the gate line 1 and the data line 2. The drain electrode of the TFT 3 is connected with the pixel electrode 4, and the pixel electrode 4 is a plate-like electrode. The passivation layer 12 is provided on the pixel electrode 4, the TFT 3, the data line 2 and the gate insulating layer 11. The common electrode 6 is provided on the passivation layer 12. The common electrode 6 is a slit electrode with slits 63. The common electrode 6 is connected with the common electrode line 5 via a connection hole 53 formed in the passivation layer 12.

The passivation layer 12 of the embodiment of the invention comprises a first region 121 located above the pixel electrode 4, a second region 122 located above the gate line 1 and a third region 123 located above the data line 2. The first region 121 has a first thickness h1, a second region 122 has a second thickness h2, and the third region 123 has a third thickness h3. The first thickness h1 is smaller than the second thickness h2, and the second thickness h2 is smaller than the third thickness h3. The common electrode 4 may at least be provided on the first region 121, the second region 122 and the third region 123 of the passivation layer 12.

The gate line 1 is used to provide an "ON" signal to the TFT 3, and the data line 2 is used to provide a data signal to the pixel electrode 4. The TFT 3 is an active switching element. The common electrode line 5 is used to provide a common signal to the common electrode 6. After the gate line 1 provides an "ON" signal to the TFT 3, the data signal from the data line 2 can be inputted into the pixel electrode 4 via the TFT 3, thus an electrical filed for driving the liquid crystal is established between the pixel electrode 4 and the common electrode 6.

In another embodiment, the common electrode line may be formed integrally with the common electrode. In this case, the connection hole provided in the passivation layer is not needed any more.

For the FFS type TFT-LCD array substrate according to the embodiment of the invention, the common electrode is formed above the gate line and the data line, generating parasitic capacitance, which decreases the adverse effect on the liquid crystal molecules around the gate line and the data line and increases the aspect ratio of the formed panel. At the same time, the thickness of the passivation layer above the pixel electrode is thinner compared with the conventional structure, so that the driving voltage on the liquid crystal is reduced and the power consumption can be decreased. In addition, the thickness of the passivation layer above the gate line and the data line is thicker compared with the conventional structure, so that the adverse effect on the signals of the gate line and the data line by the signal of the common electrode is reduced and the displaying quality of the liquid crystal display can be more ensured.

A manufacturing method of an FFS type TFT-LCD array substrate according to an embodiment of the invention will be described in detail hereinafter.

The manufacturing method of the FFS type TFT-LCD array substrate according to the embodiment of the invention comprises the following steps.

Step 1, depositing an insulating film with a third thickness on a transparent substrate formed thereon with a gate line, a data line, a thin film transistor and a pixel electrode.

Step 2, forming a passivation layer pattern by a patterning process. The passivation layer comprises a first region located above the pixel electrode, a second region located above the gate line and a third region located above the data line. The first region has a first thickness, the second region has a second thickness, and the third region has a third thickness, wherein the first thickness is smaller than the second thickness, and the second thickness is smaller than the third thickness.

Step 3, depositing a transparent conductive film and forming a common electrode pattern by a patterning process, wherein the common electrode is formed at least above the first region, the second region and the third region.

For example, the first thickness is about 2000 Å, the second thickness is about 4500 Å and the third thickness is about 6000 Å.

The above step in which the gate line, the data line, the thin film transistor and the pixel electrode are formed on the transparent substrate can be carried out according to a four-patterning process, or be carried out according to methods well known by those skilled in the related art, which are not described herein for simplicity.

A common electrode line may be formed simultaneously with the gate line, or may be formed simultaneously with the transparent conductive film. The transparent conductive film may be, for example, indium zinc oxide (IZO) or indium tin oxide (ITO).

The patterning process mentioned in the embodiment of the invention may comprise processes such as applying photoresist, masking, exposing and developing photoresist, etching, and removing remaining photoresist. A positive photoresist is taken as an example.

An example of the above step 2 is described in further detail with reference to FIGS. 3a-7b hereinafter.

Figure 3A:
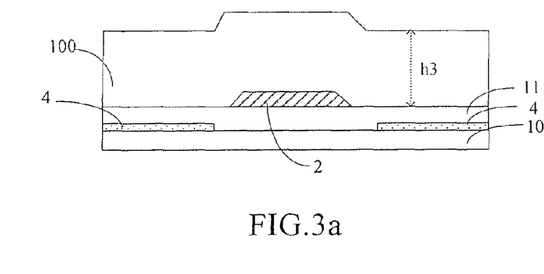
FIG. 3a and FIG. 3b are cross-sectional views after depositing an insulating film.
Figure 3B:
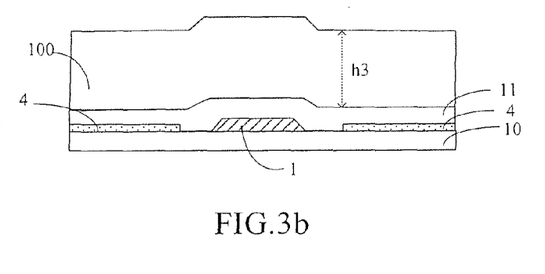

FIG. 3a and FIG. 3b are cross-sectional views after depositing an insulating film. The positions of the section lines are the same to those for FIG. 2a and FIG. 2b, respectively. As shown in FIGS. 3a and 3b, on a transparent substrate 10 formed with a gate line 1, a data line 2, a thin film transistor and a pixel electrode 4, an insulating film 100 with a third thickness h3 is deposited first. The insulating film may be of silicon nitride or silicon oxynitride.

Figure 4A:
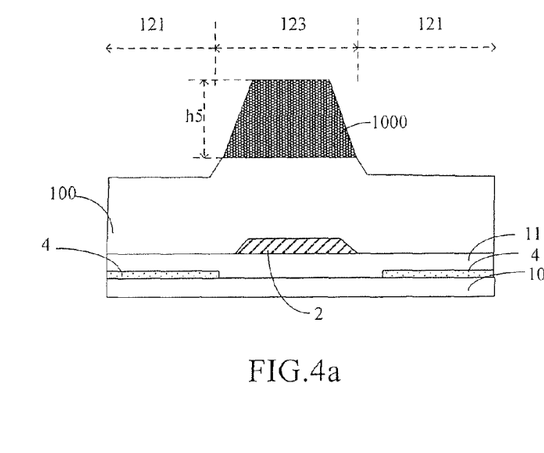
FIG. 4a and FIG. 4b are cross-sectional views after applying photoresist and performing exposure on the structure of FIG. 3a and FIG. 3b.
Figure 4B:
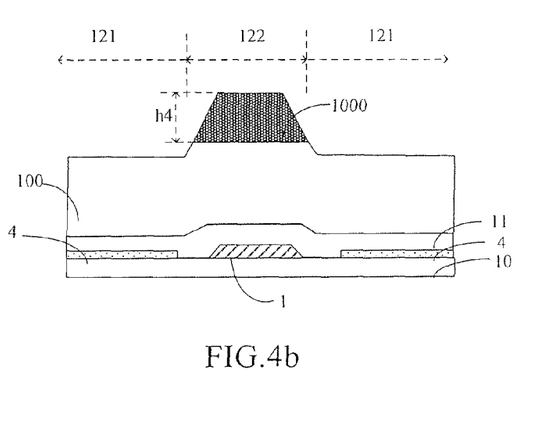

FIG. 4a and FIG. 4b are cross-sectional views after applying photoresist on the structure of FIG. 3a and FIG. 3b and performing exposure and development on the photoresist. As shown in FIGS. 4a and 4b, after applying photoresist 1000 on the insulating film 100, the photoresist 1000 is exposed and developed with a dual tone mask, so that no photoresist is left on the firs region 121, the photoresist 1000 on the second region 122 has a fourth thickness h4, and the photoresist 1000 on the third region 123 has a fifth thickness h5. The fourth thickness h4 is smaller than the fifth thickness h5. The dual tone mask comprises a half tone mask and a gray tone mask.

Figure 5A:
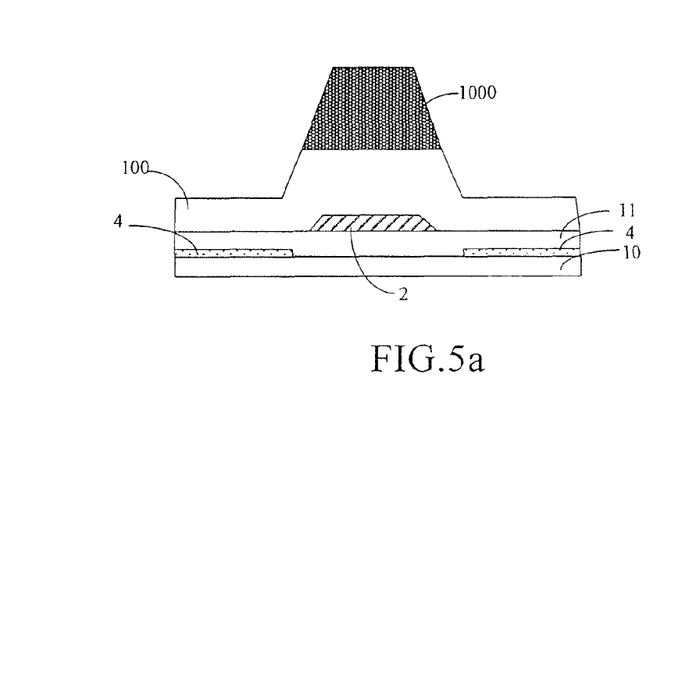
FIG. 5a and FIG. 5b are cross-sectional views after performing a first etching process on the structure of FIG. 4a and FIG. 4b.
Figure 5B:
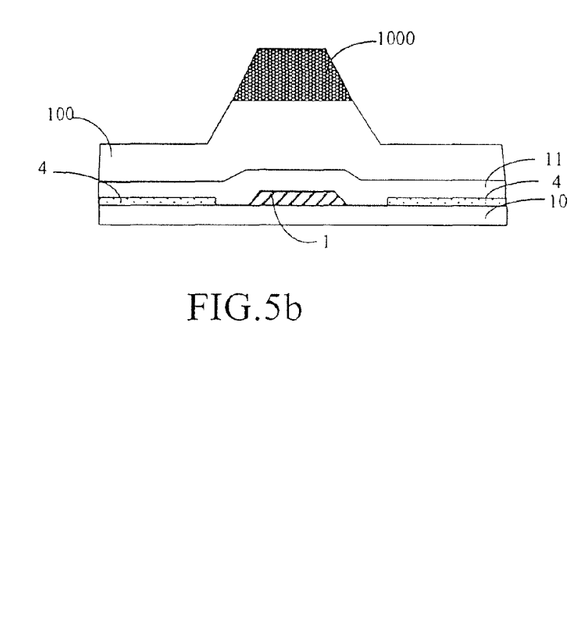

FIG. 5a and FIG. 5b are cross-sectional views after performing a first etching process on the structure of FIG. 4a and FIG. 4b. As shown in FIG. 5a and FIG. 5b, the first etching process is performed so as to etch the insulating film 100 in the first region 121 not covered by the photoresist, and control the etching thickness to be 2500 Å (i.e., the difference between the first thickness and the second thickness) by adjusting the etching conditions (e.g., etching time).

Figure 6A:
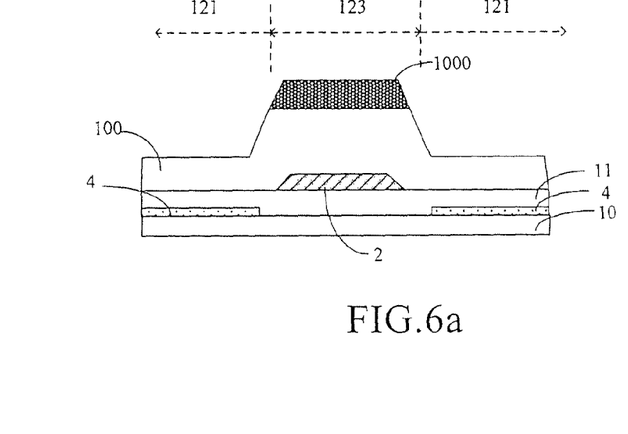
FIG. 6a and FIG. 6b are cross-sectional views after performing an ashing process on the structure of FIG. 5a and FIG. 5b.
Figure 6B:
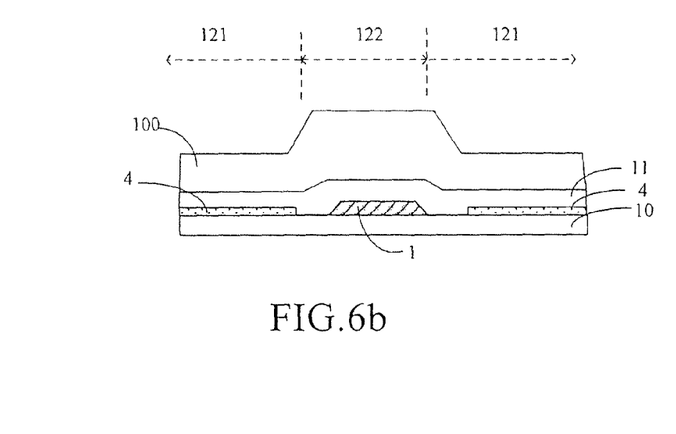

FIG. 6a and FIG. 6b are cross-sectional views after performing an ashing process on the structure of FIG. 5a and FIG. 5b. As shown in FIG. 6a and FIG. 6b, the ashing process is performed so as to remove the photoresist 1000 by the fourth thickness h4 and expose the insulating film 100 in the second region 122. The thickness of the photoresist 1000 in the third region 123 is also reduced by the fourth thickness h4.

Figure 7A:
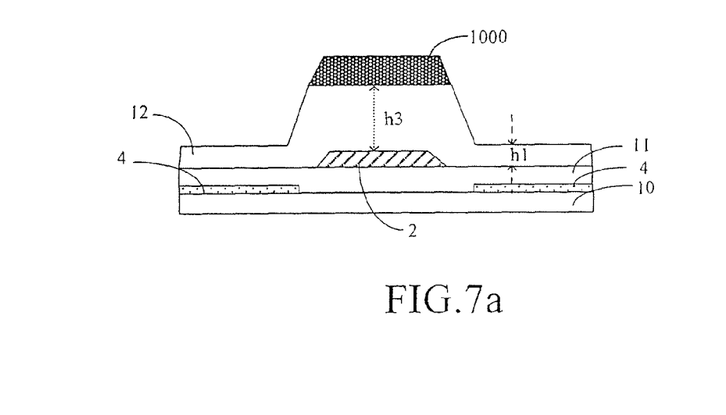
FIG. 7a and FIG. 7b are cross-sectional views after performing a second etching process on the structure of FIG. 6a and FIG. 6b.
Figure 7B:
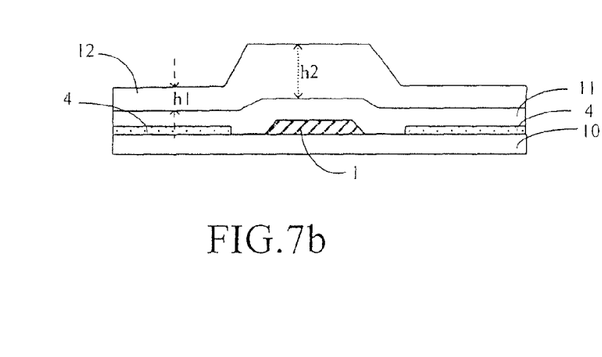

FIG. 7a and FIG. 7b are cross-sectional views after performing a second etching process on the structure of FIG. 6a and FIG. 6b. As shown in FIG. 7a and FIG. 7b, the second etching process is performed so as to etch the insulating layer 100 in the first region 121 and the second region 122 and form a pattern of passivation layer 12. The etching thickness may be 1500 Å, i.e., the difference between the third thickness and the second thickness. The obtained passivation layer 12 has a first thickness h1 of 2000 Å in the first region, a second thickness h2 of 4500 Å in the second region 122 and a third thickness h3 of 6000 Å in the third region 123.

Then, the remaining photoresist is removed.

It should be mentioned that the common electrode line is formed in the above step 1, and a connection hole is needed in the passivation layer. The connection hole may further be formed in the passivation layer above the common electrode line with another patterning process after completing the step shown in FIG. 7a and FIG. 7b. Or, the connection hole may be formed by a patterning process with a three tone mask also in the step shown in FIG. 4a and FIG. 4b. The formation of the connection hole can be realized easily for those skilled in the related art with the teaching of the above embodiment of the invention, so the detailed description is omitted here.

In addition, in another embodiment, the second thickness may be equal to the third thickness. In this case, the patterning of the passivation layer may be performed only with a normal mask, or the patterning of the convention hole can be performed simultaneously with a dual tone mask. However, since there is the gate insulating layer above the gate line, the thickness of the passivation layer located above the gate line may be relatively large and the step on the array substrate is relatively high. Therefore, in this case the rubbing process on the orientation layer on the substrate may be carefully conducted so as to avoid failure such as light leaking.

The embodiments of the invention are described by taking an FFS type TFT-LCD array substrate as an example. However, the invention is not limited to the FFS type TFT-LCD array substrate. The invention can also be applied to other TFT-LCD array substrate, such as a TN type TFT-LCD array substrate. In the TN type TFT-LCD array substrate, gate lines, data lines and common electrode lines are formed on, for example, a transparent substrate; the passivation layer is formed on the gate line, the data line and the common electrode line, the pixel electrode is formed on the passivation layer; the common electrode line and the pixel electrode are overlapped so as to form a storage capacitor; and therefore the thickness of the passivation layer between the pixel electrode and the common electrode line can be reduced, and the storage capacitance can become larger with the same overlapping area of the pixel electrode and the common electrode line, which leads to more stable displaying performance.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT-LCD) array substrate comprising a transparent substrate and a gate line, a data line, a thin film transistor, a pixel electrode and a passivation layer that are formed on the transparent substrate,
    wherein the passivation layer includes a first region corresponding to the pixel electrode, a second region corresponding to an entirety of the gate line and a third region corresponding to an entirety of the data line, the first region has a first thickness, the second region has the second thickness, the third region has the third region, and
    wherein the first thickness is smaller than the second thickness, the second thickness is smaller or equal to the third thickness.

2. The TFT-LCD array substrate of claim 1, further comprising a common electrode, wherein, the common electrode is at least provided on the first, second and third regions of the passivation layer, the passivation layer is formed on the pixel electrode, the gate line and the data line, and the common electrode is formed on the passivation layer.

3. The TFT-LCD array substrate of claim 2, further comprising a common electrode line provided in parallel with the gate line on the transparent substrate.

4. The TFT-LCD array substrate of claim 3, wherein the common electrode line is connected with the common electrode via a connection hole provided in the passivation layer.

5. The TFT-LCD array substrate of claim 3, wherein the common electrode line is formed integrally with the common electrode.

6. The TFT-LCD array substrate of claim 1, further comprising a common electrode line provided on the transparent substrate, wherein, the passivation layer is formed on the gate line, the data line and the common electrode line, the pixel electrode is formed on the passivation layer, and the common electrode line and the pixel electrode are overlapped so as to form a storage capacitor.

7. The TFT-LCD array substrate of claim 6, wherein, the common electrode line is provided in parallel with the gate line.

* * * * *